(12) United States Patent
Kangaslahti et al.

(10) Patent No.: US 6,346,853 B1
(45) Date of Patent: Feb. 12, 2002

(54) PREDISTORTION LINEARIZER CIRCUIT

(75) Inventors: Pekka Kangaslahti, Espoo; Sami Kalajo, Helsinki, both of (FI)

(73) Assignee: Ylinen Electronics Oy, Kauniainen (FI)

( * ) Notice: Subject to any disclaimer, the term of this patent is extended or adjusted under 35 U.S.C. 154(b) by 0 days.

(21) Appl. No.: 09/486,353

(22) PCT Filed: Aug. 24, 1998

(86) PCT No.: PCT/FI98/00649

§ 371 Date: May 22, 2000

§ 102(e) Date: May 22, 2000

(87) PCT Pub. No.: WO99/10987

PCT Pub. Date: Mar. 4, 1999

(30) Foreign Application Priority Data

Aug. 27, 1997 (FI) .................................................. 973525

(51) Int. Cl.[7] .............................. H03F 1/26; H03F 1/30
(52) U.S. Cl. .................. 330/149; 330/43; 375/197; 455/63
(58) Field of Search .................. 330/43, 149; 375/297; 455/63

(56) References Cited

U.S. PATENT DOCUMENTS

| | | | |
|---|---|---|---|
| 4,752,743 A | 6/1988 | Pham et al. | 330/149 |
| 5,274,271 A | 12/1993 | McEwan | 307/108 |
| 5,291,148 A | 3/1994 | Reisner et al. | 330/149 |
| 5,422,607 A | 6/1995 | McEwan | 333/20 |
| 5,523,716 A | 6/1996 | Grebliunas et al. | 330/149 |
| 5,576,660 A | 11/1996 | Pouysegur et al. | 330/149 |
| 5,742,201 A * | 4/1998 | Eisenberg et al. | 330/149 |

FOREIGN PATENT DOCUMENTS

| | | | |
|---|---|---|---|
| EP | 0 451 909 A2 | 10/1991 | |
| EP | 0 451 909 A3 | 10/1991 | |
| EP | 0 453 744 | 10/1991 | |
| GB | 2 243 736 | 11/1991 | |
| JP | 6104658 | * 4/1994 | 330/149 |

OTHER PUBLICATIONS

A.N. D'Andrea et al., "RF Power Amplifer Linearization Through Amplitude and Phase Predistortion", IEEE Transactions on Communications, vol. 44, No. 11, pp. 1477–1484, (1996).

O. Ata, "An Amplifer Predistort Lineariser for Future Mobile Radio Basestations", Proceedings of the Thirteenth National Radio Science Conference, Cairo, Egypt, pp. 1–8, (1996).

* cited by examiner

*Primary Examiner*—Michael B Shingleton
(74) *Attorney, Agent, or Firm*—Finnegan, Henderson, Farabow, Garrett, & Dunner, L.L.P.

(57) ABSTRACT

A predistortion linearizer circuit comprising an amplitude distorting part (AM/AM) and a phase distorting part (AM/PM). At least the phase distorting part (AM/PM) comprises broadband biasing means (51) and a non-linear transmission line (L51/D51 to L55/D55) responsive to them. The biasing means (51) are arranged to bias the non-linear transmission line (L51/D51 to L55/D55) to a substantially phase distorting area. The characteristics of the circuit can be changed by adjusting a biasing voltage (VB1) or by switching some of the diodes (D54, D55) inactive by activation signals (VA1, VA2). The amplitude distorting part (AM/AM) and the phase distorting part (AM/PM) can be similar in structure, but the diodes (D51 to D55) are partly forward-biased, whereby the losses caused by them decrease the amplitude of the signal.

8 Claims, 1 Drawing Sheet

PREDISTORTION LINEARIZER CIRCUIT

BACKGROUND OF THE INVENTION

The invention relates to a predistortion linearizer circuit and a method on which it is based. The predistortion linearizer circuit of the invention is primarily intended to be used to predistort the amplitude and phase of the input signal of a travelling wave tube amplifier in order to cancel the amplitude and phase distortion caused by the amplifier. To be more precise, the purpose of the predistortion linearizer circuit of the invention is that the third and fifth order intermodulation distortion, AM/AM and AM/PM response, AM/PM transition and noise/power ratio of the linearized travelling wave tube amplifier can be substantially minimized.

Prior art predistortion linearizer circuits have been implemented by means of one or two non-linear components (a diode or a transistor, for instance) and by dividing a signal into two branches: linear and non-linear. The former solution utilizes the increase of transmission loss or reflection of the non-linear component as a function of the input power. In the latter solution, the non-linear branch being compressed is added to the linear branch by an appropriate phase shift and amplitude. A predistortion linearizer circuit operating at a certain frequency can be formed in both ways. A predistortion linearizer circuit of this kind is disclosed in U.S. Pat. No. 4,752,743, for instance. A predistortion linearizer circuit PDL can be used in accordance with FIG. 1, for example, to predistort the input signal of a travelling wave tube amplifier TWTA. The predistortion linearizer circuit consists of two main parts: an amplitude distorting part AM/AM and a phase distorting part AM/PM. (The two-part term AM/PM is meant to indicate that amplitude modulation of the input signal causes phase modulation (unit °/dB) of the output signal. In addition, the predistortion linearizer circuit PDL comprises a mechanism for inhibiting direct current (and a modulation frequency signal). In FIG. 1, this kind of mechanism is a capacitor C11 coupled in series with the signal, but it can also be a transformer (not shown), etc.

The problem in the prior art predistortion linearizer circuits is that they operate only in a narrow frequency band. If the operating frequency is changed, the prior art predistortion linearizer circuits must be tuned to the new operating frequency. In other words, they are not sufficiently broadband.

BRIEF DESCRIPTION OF THE INVENTION

An object of the invention is to provide a predistortion linearizer circuit that operates in a broader frequency band than the prior art predistortion linearizer circuits. The objects of the invention can be achieved with a method and a predistortion linearizer circuit which are characterized by what is stated in the characterizing parts of the independent claims. The preferred embodiments of the invention are disclosed in the dependent claims.

The invention is based on the observation that the phase-frequency distortions of a non-linear transmission line with a certain transit time and biased by appropriate biasing means and of a travelling wave tube amplifier as a function of the input power are inversely related over a broad frequency band. The basis of the implementation of the invention is that at least the phase distorting part of the predistortion linearizer circuit comprises a non-linear transmission line and broadband biasing means for appropriately biasing the non-linear transmission line to an operating point changing with incoming amplitude modulation. In this connection, the broadband biasing means imply that at a modulation bandwidth their input impedance is designed to be suitable for detecting the modulation, but at a carrier frequency their input impedance is high. The structure is thus of the type of a low-pass filter. The transmission line comprises several stages, each comprising an inductance coupled in series with the signal and a capacitance coupled in parallel with the signal. In practice, the transmission line is formed by a component arrangement satisfying the characteristic transmission line equations known to those skilled in the art, as will be described below. The minimum number of the stages is two; in practice about 20 stages are necessary. A non-linear transmission line means that an inductance and/or a capacitance (in practice capacitance) changes as a function of the instantaneous voltage or currency of an input signal. The carrier wave power must thus be detected and the transmission line voltage in the modulation band must be controlled by the detected signal. The practical implementation of the non-linear transmission line is usually an inductance in series with the signal and an appropriately biased semiconductor junction, such as a diode, in parallel with the signal.

The predistortion linearizer circuit of the invention is a broadband one. Its phase-frequency distortion in a broad frequency band is inverse to the phase-frequency distortion caused by a travelling wave tube. The propagation delay of the travelling wave tube becomes longer with the increase of the input power, while the propagation delay of the predistortion linearizer circuit of the invention correspondingly becomes shorter, so the phase-frequency distortions of the predistortion linearizer circuit and travelling wave tube cancel each other out over the broad frequency band.

The active part of the predistortion linearizer circuit of the invention is an extremely simple non-linear transmission line. In practice the transmission line is implemented by two components, one of which can be merely a short bit of wire. This makes diverse modifications possible without making the whole circuit considerably more complex. The non-linear transmission line is known from other contexts, so those skilled in the art can easily manage its implementation, design and behaviour.

BRIEF DESCRIPTION OF THE DRAWINGS

The invention is now described in closer detail in connection with preferred embodiments with reference to the accompanying drawings, in which.

DETAILED DESCRIPTION OF THE INVENTION

Figure 2:
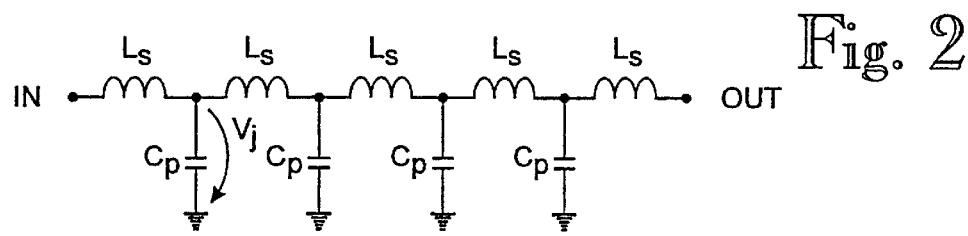
FIGS. 2 to 3 show an equivalent circuit of a transmission line.

FIG. 2 shows an equivalent circuit of a transmission line. The transmission line with its equivalent circuits and designs is technique well known to those skilled in the art, but to use it in a predistortion linearizer circuit is novel. The transmission line comprises inductances Ls in series with the signal and capacitances Cp coupled in parallel with the signal. A non-linear transmission line is formed in such a manner that the value of a capacitance Cp changes as a function of a voltage Vj across it, in other words Cp=C(Vj). When the RF power of an input signal is detected by an appropriate technique, and the voltage Vj is controlled by the detected AM signal, the Cp can be decreased when the input power increases. In practice, the parallel capacitance Cp is implemented in a circuit by an appropriate semiconductor barrier, such as a PN junction, Schottky junction or PIN diode. All operations essential for non-linearity, i.e. the detection of the RF power, the control of the voltage Vj by means of broadband biasing means and the non-linear capacitance Cp, are combined in this kind of junction. Any barrier or component whatsoever that implements these three essential operations qualifies as a diode in the sense of the present application.

As is known, the characteristic impedance of a transmission line $Z_O = \sqrt{Ls/Cp}$ and propagation coefficient $y=\omega \sqrt{LsCP}$. A suitable coil or a short bit of any high impedance wire, such as a microstrip, for instance, may operate as a series inductance Ls. The characteristic impedance $Z_O$ is typically designed to be 50Ω.

Figure 3:
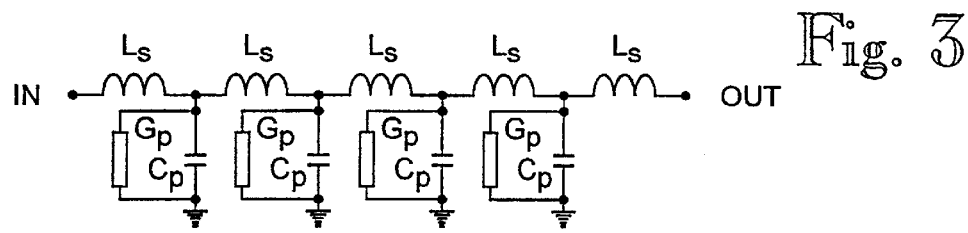

FIG. 3 shows the equivalent circuit of a transmission line in a situation where a detecting junction is biased to a conducting range. A conductance Gp, which causes losses in the line, is formed in parallel to capacitances Cp. The conductance Gp also depends on the voltage Vj across the junction. When the junction voltage Vj thus changes as the input power increases, the conductance Gp decreases and the attenuation of the line decreases. A non-linear transmission line thus distorts amplitude when biased in a certain manner, and when biased in another manner it distorts phase, in other words the propagation delay. Amplitude distortion also distorts the phase at the same time, but an appropriate phase and amplitude predistortion can be achieved by choosing appropriate phase and amplitude distortions and by placing a broadband amplifier between the parts.

Figure 4:
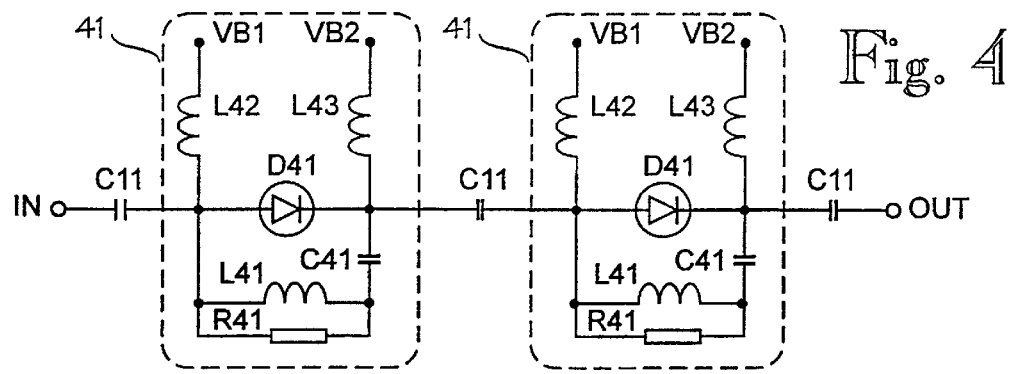
FIG. 4 shows an embodiment of an amplitude distorting part.

FIG. 4 shows an embodiment of an amplitude distorting part AM/AM. Amplitude distortion can be achieved by a diode D41 which is coupled in series with a signal and with which a parallel-resonant circuit comprising a capacitor C41 and an inductance L41 have been coupled in parallel. The inductance L41 is parallel-resonant with the (capacitive) reactance of the diode D41 in the circuit's operating frequency. This efficiently inhibits signal propagation through the reactive components of the circuit and thus inhibits the generation of phase distortion. The resistance of a resistor R41 lowers the Q factor of the resonance circuit and thus increases the operating frequency band of the circuit. The resistance determines the transmission loss of the circuit at a low input power, when the diode D41 does not conduct. The diode D41 is biased by an adjustable bias voltage VB1–VB2 through coils L42 and L43, which inhibit the propagation of a radio frequency signal. When the input signal amplitude with the bias voltage added to it becomes higher than the threshold voltage of the forward conduct of the diode D41, the diode D41 starts conducting a certain part of the input signal cycles. The mean resistance during a cycle decreases and the attenuation of the propagating signal decreases as a function of the input power. This decrease of attenuation taking place as the function of the input power can be controlled by the bias voltage VB1–VB2. In FIG. 4 two such parallel couplings 41 of a biased diode and a resonance circuit are coupled in series to ensure sufficient dynamic range. There can, of course, be more than two of them. In addition, broadband amplifiers can be coupled between and/or after the parts 41 in order to compensate for losses.

Figure 1:
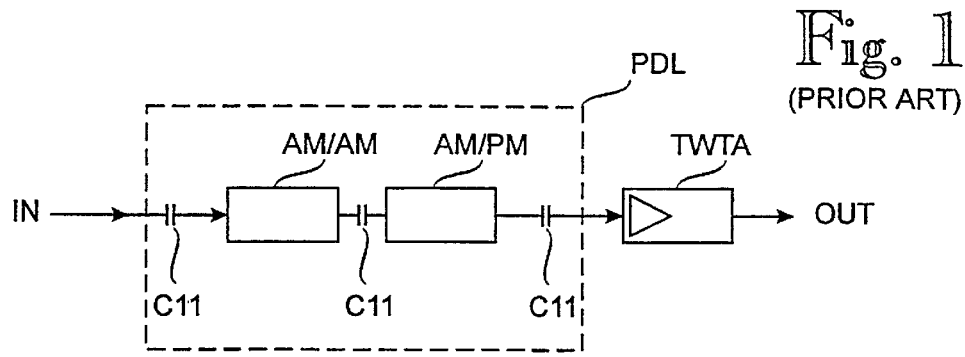
FIG. 1 shows a schematic view of a predistortion linearizer circuit.
Figure 5:
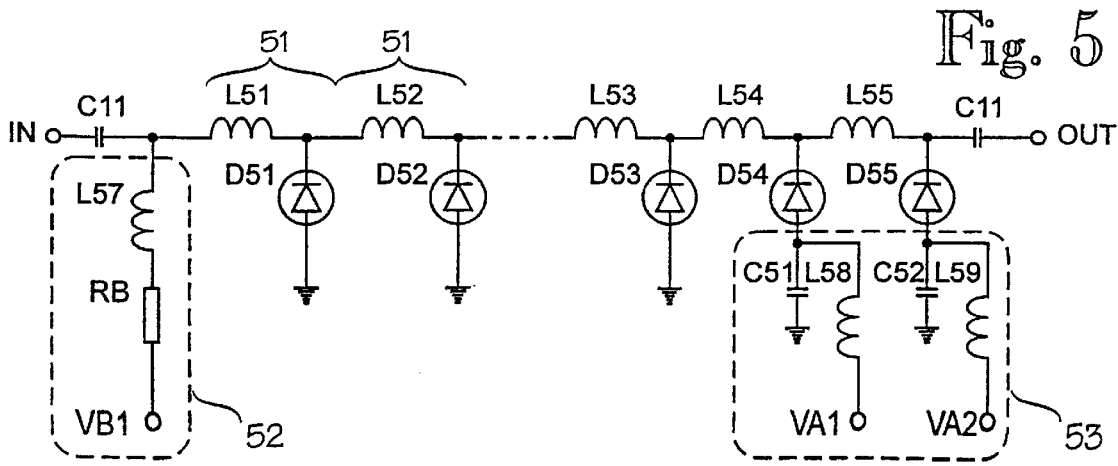
FIG. 5 shows a suitable circuit for distorting both phase and amplitude.

FIG. 5 shows, as an embodiment of a circuit suitable for phase distortion (block AM/PM in FIG. 1). The circuit of FIG. 5 is based on the usage of an appropriately biased non-linear transmission line for predistorting a signal. The non-linear transmission line comprises several stages 51 formed by a series inductance and a parallel capacitance, as is shown in connection with FIGS. 2 and 3. In FIG. 5, series inductances are coils L51 to L55, and parallel capacitances are capacitances Cp of diodes D51 to D55. The transmission line is biased by a bias voltage VB1 through a resistor RB and a coil L57. The dotted line between coils L52 and L53 illustrates the fact that more or fewer stages 51 formed by the series inductance and the parallel capacitance can be coupled in series than shown in FIG. 5. The operation of these stages 51 is described in connection with FIGS. 2 and 3. The values of the series inductance and the parallel capacitance determine the characteristic impedance $Z_O$ and the propagation coefficient γ of the transmission line. The inductance and the capacitance must be sufficiently low to ensure that the cutoff frequency of a low-pass type line is clearly above the operating frequency. When the input power increases, the diodes D51 to D55 of the line start conducting, whereby the diodes change to be more reverse-biased on account of the voltage difference generated over the serial resistance RB of the bias line. This decreases the junction capacitance Cp of the diodes, whereby the propagation coefficient of the non-linear transmission line decreases and the electrical length of the line is shortened. The characteristics of the circuit can be adjusted by biasing, in other words by the bias voltage VB1 and/or by changing the value of the biasing resistor RB. The RB can be electrically or mechanically adjustable. The characteristics of the circuit can also be adapted by changing the number of active diodes. Reference number 53 indicates a mechanism for changing the number of active diodes. The diodes D54 and D55 have been isolated from ground by capacitors C51 and C52, respectively, and their bias voltages are applied through inductances L58 and L59. The capacitators C51 and C52 are designed in such a manner that they ground the carrier wave frequency. The bias voltage sources are here called activation voltages VA1 and VA2 to emphasize the fact that the diodes D54 and D55 can be made entirely active or entirely inactive (as opposed to merely slightly adjusting the phase shift caused by them). If, for example, the activation voltage VA1 is sufficiently negative, the diode D54 is clearly reverse-biased at all input power values. The capacitance of the diode D54 is thus not changed as a function of the input power, and the change in the propagation coefficient of the line and in the electrical length as a function of the input power decrease. The advantage of this kind of circuit is that there is a wide range of possible configurations.

The circuit of FIG. 5 can also be used for distorting the amplitude. This is performed by partly forward-biasing the diodes D51 to D55, as was described in connection with FIG. 3.

A predistortion linearizer circuit PDL in accordance with FIG. 1 can be implemented by coupling an amplitude distorting part of FIG. 4 and a phase distortion circuit of FIG. 5 in series. As an alternative to this arrangement, two circuits of FIG. 5 can be coupled in series, the first circuit changing the amplitude and the second the phase (or vice versa). The diodes D51 to D55 of the phase changing circuit are reverse-biased and the diodes D51 to D55 of the amplitude changing circuit are partly forward-biased. The advantage of the latter arrangement is that the phase distorting part and the amplitude distorting part of the predistortion linearizer circuit are similar in structure, the different biasing being the only difference between them.

It will be obvious to those skilled in the art that the basic idea of the invention can be implemented in many ways. The invention and its embodiments are thus not restricted to the examples described above but they can vary within the scope of the claims.

What is claimed is:

1. A method for predistorting a radio frequency input signal, the method comprising:

inhibiting the propagation on direct current and modulation frequency;

biasing a non-linear transmission line to a substantially phase distorting range, the non-linear transmission line comprising at least one inductance coupled in series with the input signal and at least one diode coupled in parallel with the input signal; and subjecting the radio frequency input signal to amplitude distortion and phase distortion by applying the input signal through the non-linear transmission line at least during phase distortion.

2. A predistortion linearizer circuit for predistorting a radio frequency input signal, comprising:

a direct current and modulation frequency inhibitor;

an amplitude distorting part; and a phase distorting part; wherein at least the phase distorting part comprises broadband biasing means and a non-linear transmission line responsive to the broadband biasing means, the non-linear transmission line comprising at least one inductance coupled in series with the input signal and at least one diode coupled in parallel with the input signal; and the broadband biasing means are arranged to bias the non-linear transmission line to a substantially phase distorting range.

3. A predistortion linearizer circuit as claimed in claim 2, wherein the non-linear transmission line comprises several inductances and diodes in a ladder configuration and means by which some of the diodes can be switched to an inactive state.

4. A predistortion linearizer circuit as claimed in claim 3, wherein the means by which some of the diodes can be switched to an inactive state comprises a capacitance isolating each diode to be switched from ground, and means for strongly reverse-biasing each of said diodes.

5. A predistortion linearizer circuit as claimed in any one of claims 2 to 4, wherein the amplitude distorting part comprises at least one stage comprising a diode with its biasing means coupled in series with the input signal and a parallel-resonant circuit coupled in parallel with the diode and comprising a resistance lowering its Q factor.

6. A predistortion linearizer circuit as claimed in claim 5, further comprising several substantially similar stages that are coupled in series.

7. A predistortion linearizer circuit as claimed in claim 2, wherein the amplitude distorting part is substantially similar in structure to said phase distorting part, said non-linear transmission line being biased to a substantially amplitude distorting range.

8. A predistortion linearizer circuit as claimed in claim 2, further comprising a plurality of amplitude and/or phase distorting parts coupled in series and amplifiers coupled between them.

* * * * *